(12) United States Patent
Hargan

(10) Patent No.: US 7,248,088 B2
(45) Date of Patent: *Jul. 24, 2007

(54) DEVICES AND METHODS FOR CONTROLLING A SLEW RATE OF A SIGNAL LINE

(75) Inventor: Ebrahim H. Hargan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/497,485

(22) Filed: Aug. 1, 2006

(65) Prior Publication Data

US 2006/0267651 A1 Nov. 30, 2006

Related U.S. Application Data

(63) Continuation of application No. 10/847,199, filed on May 17, 2004, now Pat. No. 7,126,394.

(51) Int. Cl.
  *H03K 5/12* (2006.01)
(52) U.S. Cl. .................................................. 327/170
(58) Field of Classification Search ................. 327/108, 327/112, 170; 326/83, 85
  See application file for complete search history.

(56) References Cited

U.S. PATENT DOCUMENTS

| 5,877,647 | A | 3/1999 | Vajapey et al. |
|---|---|---|---|
| 6,066,971 | A | 5/2000 | Pappert et al. |
| 6,087,847 | A | 7/2000 | Mooney et al. |
| 6,185,256 | B1 | 2/2001 | Saito et al. |
| 6,294,924 | B1 | 9/2001 | Ang et al. |
| 6,414,524 | B1 | 7/2002 | Chen |
| 6,420,913 | B1 * | 7/2002 | Ang et al. .................. 327/108 |
| 6,476,654 | B2 | 11/2002 | Tanaka |
| 6,492,686 | B1 | 12/2002 | Pappert et al. |
| 6,608,506 | B2 | 8/2003 | Ang et al. |
| 6,704,818 | B1 | 3/2004 | Martin et al. |
| 6,753,699 | B2 | 6/2004 | Stockstad |
| 2005/0001653 | A1 | 1/2005 | Ahmad |
| 2005/0253635 | A1 | 11/2005 | Hargan |

OTHER PUBLICATIONS

Dally et al., *Digital Systems Engineering*, Cambridge University Press, Jun. 28, 1998, pp. 365-366.
Dally et al., "Transmitter Equalization for 4Gb/s Signaling," *IEEE Micro*, vol. 17, No. 1, Jan./Feb. 1997, 10 pages.

* cited by examiner

*Primary Examiner*—My-Trang Nu Ton
(74) *Attorney, Agent, or Firm*—Knobbe, Martens, Olson & Bear, LLP

(57) ABSTRACT

In one aspect of the invention, a method of reducing intersymbol interference on a signal line is disclosed. A state machine records previous bits that were transmitted over the line. If the bit on the line has been static for several clock cycles, the slew rate will be increased to facilitate correct reading of the bit for the next clock cycle. If the bit on the line has been dynamic for the previous bits, the slew rate will be a lower slew rate to avoid crosstalk between neighboring lines.

20 Claims, 9 Drawing Sheets

DEVICES AND METHODS FOR CONTROLLING A SLEW RATE OF A SIGNAL LINE

RELATED APPLICATION

The present invention is a continuation of, and claims benefit of priority under 35 U.S.C. 120 from, U.S. patent application Ser. No. 10/847,199, filed May 17, 2004, now U.S. Pat. No. 7,126,394, issued Oct. 24, 2006, which is hereby incorporated herein by reference in its entirety.

BACKGROUND OF THE INVENTION

1. Field of the Invention

The present invention relates to integrated circuit devices, particularly to the field of memory devices.

2. Description of the Related Art

Since the introduction of the digital computer, electronic storage devices have been a vital resource for the retention of data. One type of memory is Dynamic Random Access Memory (DRAM). DRAMs typically incorporate capacitor and transistor type memory cells. The memory cells temporarily store data based on the charged state of the capacitor structure.

DRAM circuits are increasingly using faster clock frequencies, which results in increased bandwidth for the user. Currently, DRAMs available on the market are capable of clock frequencies in the range of 100 MHz to 400 MHz. Future developments will rapidly push the frequency to 700 MHz and beyond. Additionally, the use of double data rate (DDR) architecture, which transfers four data bits every two clock cycles at the I/O pins, allows the DRAM to further increase its maximum bandwidth.

However, increasing the clock frequency also introduces several problems in addition to the benefits gained in terms of speed. One such problem is a smaller noise margin. The noise margin is the measure of the extent to which a logic circuit can tolerate noise or unwanted spurious signals. With respect to timing, a smaller noise margin results in a smaller time interval during which the charge state of the capacitor can be accurately determined. As the operating frequencies increase, the rise times and fall times of signal pulses can be as long or even longer than the pulse width, thus decreasing the effective pulse widths of the signal pulses.

Intersymbol interference (ISI) can also become a significant factor in the performance of high frequency DRAM. ISI is the distortion of the signal, which is caused by residual energies on a line due to the past history of inputs that had insufficient time to reach a steady state before the next cycle resulting in shrinking bit valid times. The combination of the smaller noise margin and increased intersymbol interference at higher frequencies can result in a loss of performance.

An example of a problem which contributes to ISI is the failure of a switched signal to reach a reference voltage before being switched again. If the voltage on a signal line does not reach the reference voltage, the signal level may not be sufficiently high (or sufficiently low) to be determined unambiguously each time. If the signal level cannot be correctly determined, data that is to be transferred based on the occurrence of the signal may be transferred incorrectly. In order to assure that the signal is received properly, the bit valid time must be increased (e.g., the amount of time during which the signal level can be determined unambiguously must be increased). One method to increase the bit valid time is to dynamically adjust the voltage of the signal. In this method, the low frequency signals are attenuated, and the high frequency portion of the signal is amplified. However, such regulation of the voltage may require additional power supplies or other additional circuit devices that can increase the cost of DRAMs.

Other methods of remedying the foregoing problems have also been proposed. However, the implementation of systems to control intersymbol interference has substantially increased process costs. Thus, a need exists for a solution that addresses the foregoing problems using available control methods.

SUMMARY OF THE INVENTION

One aspect of the invention is a method of increasing bit valid time on a signal line. The method comprises tracking the values of a sequence of bits transmitted on the signal line and determining a current state of the signal line based on the values of a selected number of most recently received bits in the sequence. The slew rate is changed by adjusting a driving device in response to a combination of the current state of the signal line and value of a next bit in the sequence of bits.

Another aspect of the invention is a computer memory device. A transmission line communicates a sequence of data bits. A state machine monitors the sequence of data bits, determines a line state based on at least two most recent bits in the sequence, and outputs a slew rate control signal based on the line state and a next bit in the sequence of bits. A slew rate controller adjusts a rate of change of voltage on the transmission line based upon the slew rate control signal.

Another aspect of the invention is a system for selectively increasing bit valid time on a signal line of a memory device. The system comprises a state machine that tracks the previous states of the line, a driving circuit to transmit the signal on the line, and a slew rate controller for adjusting the impedance of the driving circuit. In particular, when the state of the signal line is to be changed after the signal line has been at one state for a predetermined duration, the impedance of the driving circuit is decreased so that the voltage level on the signal line can change rapidly to the opposite state. On the other hand, when the signal line has been at a current state for a short amount of time (e.g., one clock duration), the impedance of the driver circuit is increased so that the voltage level does not change as rapidly.

BRIEF DESCRIPTION OF THE DRAWINGS

The foregoing features and other features of the present invention are described below in connection with the attached drawings in which.

DETAILED DESCRIPTION OF THE PREFERRED EMBODIMENT

The following description illustrates devices and methods for minimizing intersymbol interference (ISI). In a preferred embodiment, the slew rate of signals on signal lines within a dynamic random access memory (DRAM) device are selectively increased in order to increase the bit valid time on a signal line when needed while maintaining a slower slew rate when not needed in order to reduce switching noise. In the preferred embodiment, the slew rate control is implemented using a state machine. Although a state machine can be used specifically to implement the improvements described herein, the state machine may also have other purposes in operating a DRAM device. Preferably, the regulation of slew rate does not introduce an additional controller so that using slew rate adjustment to address the issue of ISI can be accomplished with minimal additional costs.

Figure 1:
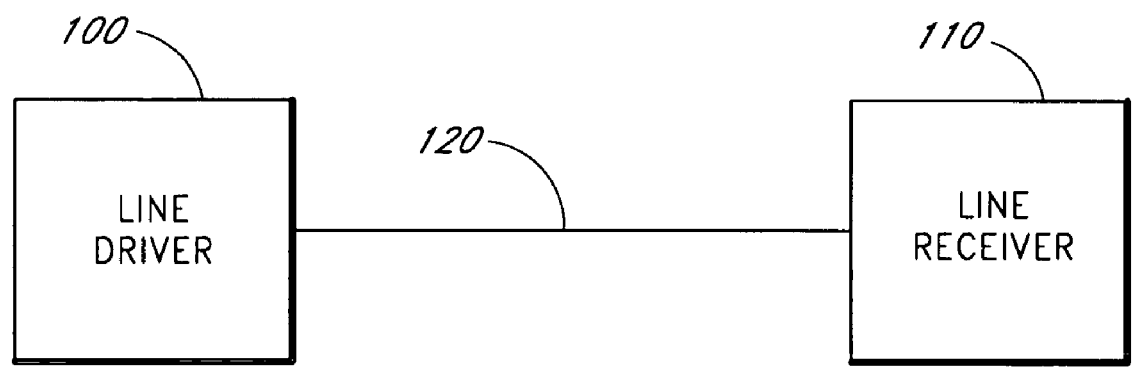
FIG. 1 illustrates an exemplary signal line driver and an exemplary signal line receiver.

FIG. 1 illustrates an exemplary signal line driver 100 and an exemplary signal line receiver 110. In the illustrated embodiment, the driver 100 and the receiver 110 are connected by a signal line 120. Although described herein in connection with a single signal line 120 between the output of the driver 100 and the input of the receiver 110, it should be understood that the apparatus and method disclosed herein can be used advantageously with a differential output driver and a differential receiver interconnected by a pair of signal lines. Generally, single-ended lines, or non-differential signal lines, suffer from poor bit valid times more than differential signal lines. The reference voltage in single-ended (non-differential) signal lines is constant at a selected voltage, $V_{REF}$, making crossing this voltage particularly important for good bit valid times.

Figure 2:
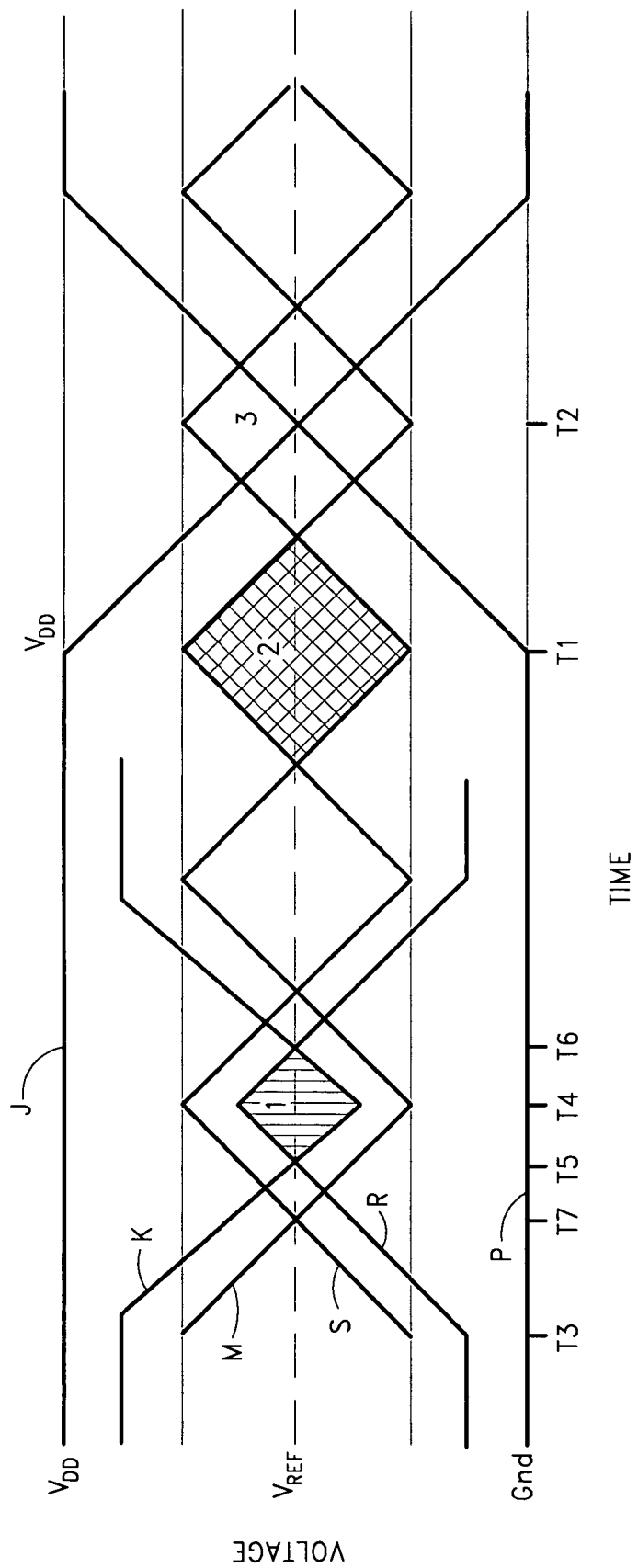
FIG. 2 illustrates timing diagrams of a signal line for different sequences of bits.

FIG. 2 illustrates graphs of signal waveforms on the signal line 120 for a plurality of bit sequences. In FIG. 2, a waveform J represents a signal on the signal line 120 that has been at a logical 1 (e.g., at a high voltage), for several (e.g., three or more) clock cycles. A similar waveform P represents a signal on the signal line 120 that has been at a logical 0 for several clock cycles. A reference voltage ($V_{REF}$) represents a signal level that must be crossed by a switching signal in order for the signal to be detected at the switched signal level. Although shown as a single line at a signal voltage level $V_{REF}$ in FIG. 2, the single value of $V_{REF}$ is illustrated for illustrative purposes only. It should be understood that the value of the signal may not be unambiguously determined in a range of voltages proximate to $V_{REF}$.

Because of the impedance of the signal line 120 (e.g., the resistance, capacitance and inductance) and the output impedance of the driver 100, the voltage on the line 120 cannot change instantaneously. Rather, when the driver 100 drives the signal toward a particular voltage level, the voltage on the signal line will reach the voltage rail (e.g., either the upper power supply voltage or the lower power supply voltage (which may be signal ground)) after a sufficient amount of time has passed. Thus, in high frequency systems, a signal that has been at a particular voltage level for a longer time (e.g., more clock cycles) may be closer to the respective voltage rail than a signal that has just switched to that voltage level. For example, in FIG. 2, a waveform K and an opposite waveform R illustrate signals that have only been at a particular voltage level for a shorter amount of time (e.g., two clock cycles). The voltage level of the waveform K is lower than the voltage level of the waveform J. Similarly, the voltage level of the waveform R is higher than the voltage level of the waveform P. In each case, the voltage levels of the waveforms K and R are farther from the respective voltage rails than the voltage levels of the waveforms J and P.

In FIG. 2, a waveform M and an opposite waveform S illustrate signals that have only been at a particular voltage level for an even shorter amount of time (e.g., one clock cycle). The voltage level of the waveform M is lower than the voltage level of the waveform K. Similarly, the voltage level of the waveform S is higher than the voltage level of the waveform SR. In each case, the voltage levels of the waveforms M and S are farther from the respective voltage rails than the voltage levels of the waveforms K and R.

In FIG. 2, the three pairs of waveforms are illustrated for a system in which the slew rate is fixed in order to demonstrate the problem caused by a fixed slew rate. In particular, the waveform J and the waveform P illustrate an inadequate slew rate at a high operating frequency. As discussed above, the waveforms J and P illustrate signals that have been at the respective signal level for a sufficient time that the respective signal level is at the respective voltage rail. Then, at a time T1, the waveform J begins to decrease towards the lower voltage rail (e.g., towards a logical zero or signal ground). Alternatively, the waveform P begins to increase towards the higher voltage rail. One clock cycle later, at a time T2, the signal level is switched so that the waveform J starts increasing to the higher voltage rail and the waveform P starts decreasing toward the lower voltage rail. It can be readily seen that for this sequence of events, the waveform J and the waveform P only reach the reference voltage $V_{REF}$ before the signal levels switch. Thus, the interval during which the waveform J can be detected as a logical 0 and the corresponding window during which the waveform P can be detected as a logical 1 have substantially zero duration. In order for the correct bit to be read, the voltage must be above or below the reference voltage for a substantial portion of the clock cycle. Waveforms J and P only reach the reference voltage, but do not cross the reference voltage. For this scenario, a faster slew rate is needed in order to increase the bit valid time to a duration adequate to assure that the signal level can be received correctly.

As discussed above, the waveforms K and R represent signals that have been at a particular signal level for only two clock cycles and thus have not reached the respective voltage rails. At a time T3, the waveforms K and R begin to switch toward the opposite voltage rails, and one clock cycle later at a time T4, the two waveforms again switch. It can be seen that the waveform K decreases below the reference voltage $V_{REF}$ and the waveform R switches above the reference voltage at a time T5, which occurs before the time T4. After the second switch in signal level at the time T4, the waveforms K and R remain above and below $V_{REF}$ until a time T6. Thus, although the signal levels were switched for only one clock cycle, the waveforms K and R crossed the reference voltage for a sufficient time to be detected at the opposite signal level. However, it can be seen that the respective opposite signal levels only have a duration of approximately one-half clock cycle. This short duration may not be adequate for some purposes.

In contrast to the waveforms J and P and the waveforms K and R, the waveforms M and S represent a scenario where the signal levels are changing every clock cycle (e.g., the waveforms M and S are shown alternating between logical 0 and logical 1 on each clock cycle). Because the signals represented by the two waveforms M and S are switching on each clock cycle, the two waveforms do not transition to voltage levels near the respective rail voltages. Thus, when the waveforms M and S begin to switch at the time T3, the two waveforms cross the reference voltage $V_{REF}$ at a time T7, which is approximately one-half clock cycle after the switching starts. Thus, although the waveforms M and S switch once per clock cycle, as illustrated in FIG. 2, the waveforms M and S remain at the opposite signal levels for substantially the duration of a clock cycle and can be unambiguously detected as the correct voltage level.

From the foregoing information, it can be seen that the slew rate of signals that remain at a particular voltage level for only one clock cycle (e.g., the signal switches once per clock cycle as represented by the waveforms M and S), do not require a faster slew rate. On the other hand, signals that remain at a particular voltage level for at least two clock cycles such that the voltage level becomes closer to the respective rail voltage (e.g., the signals K and R) require a faster slew rate so that the voltage level of the signal is switched past the reference voltage $V_{REF}$ to an opposite voltage level at a sufficiently fast rate that the signal can be detected at the opposite voltage level for an adequate portion of the clock cycle. Furthermore, signals that remain at a particular voltage level for an even longer time (e.g., three or more clock cycles, as illustrated by the signals J and P) such that the signal levels are at or close to the rail voltages require an even faster slew rate in order to change from the rail voltage and cross the reference voltage.

Simply increasing the slew rate for the signal lines in order to accommodate the scenario illustrated by the waveforms J and P is not an acceptable solution. The timing of signals will typically vary substantially, and a line that is rapidly switching at one time can stop switching for several clock cycles. Similarly, a signal that has not switched for a number of clock cycles can start switching in response to changing conditions. Thus, the slew rate does not need to be at its maximum rate in all occasions. In fact, if the slew rate is consistently too fast, the rapid signal transitions on the all the signal lines can result in, increased noise and increased crosstalk between the signal lines. To correctly balance the need for a higher slew rate to increase bit valid time and the minimization of noise on the line, the present invention uses a state machine to determine the proper slew rate in accordance with the history of the signal levels on a particular signal line and in accordance with the state of the next signal bit to be transmitted on the signal line.

In the illustrated embodiment, the state machine preferably records a series of output bits in first-in-first-out (FIFO) fashion. Depending on an acceptable level of complexity to be introduced into the system, the state machine can record a varying number of bits. In a preferred embodiment, the state machine records between about 1 and 16 bits. More preferably, the state machine records between about 2 and 8 bits. In a most preferred embodiment illustrated herein, the state machine records 3 bits.

Figure 3A:
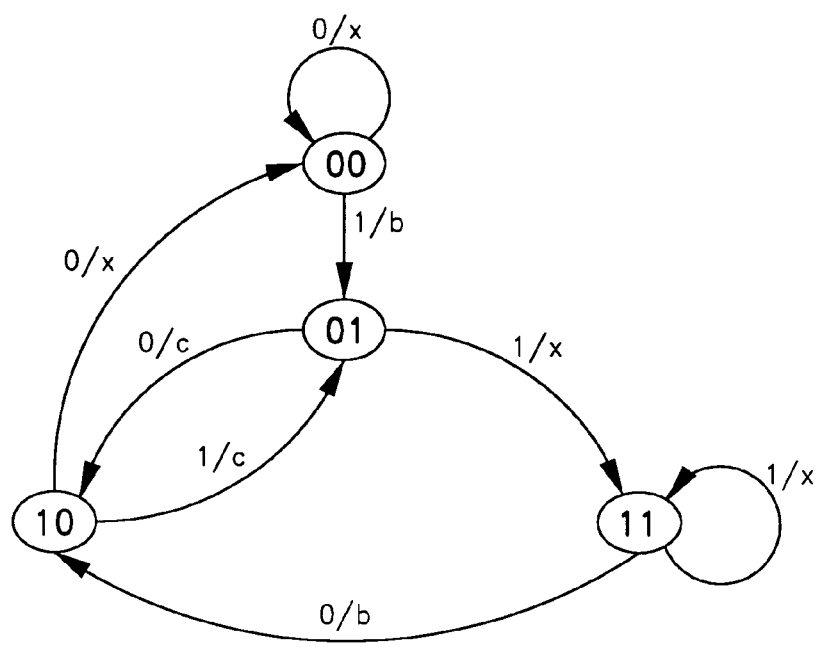
FIGS. 3A and 3B illustrate state diagrams of preferred embodiments of a state machine for implementing aspects of the present invention.

A first state machine is shown in FIG. 3A as a Mealy representation using four states and the transitions between the states. The numbers 0 and 1 are used in this chart in their typical meaning of low voltage and high voltage, respectively, although one skilled in the art will appreciate that the opposite representation can also be used. In the illustrated example, the value of the last two bits transmitted are "stored" in the state machine as the current state of the state machine. In FIG. 3A, the four states are illustrated as 00, 01, 10 and 11. The next bit to be output on the signal line is provided as an input bit to the state machine and is shown as the first character proximate to a curved transition arrow connecting two states or connecting a state to itself. The output of the state machine that controls the slew rate is determined by the last two bits transmitted and the next bit to be transmitted. The output of the state machine is shown in FIG. 3A as the letter following the slash (/) proximate to the transition arrows. For example, in FIG. 3A, the letter "c" represents a control signal to the slew rate controller to provide a nominal slew rate and the letter "b" represents a control signal to the slew rate controller to provide a fast slew rate. The letter "x" represents the don't care condition for conditions where the signal level is not changing.

In the embodiment of FIG. 3A, when the previous two transmitted bits were 00, and the next bit is a 1, a high slew rate (control signal "b") is preferred because the signal line must transition from a voltage level close to the lower voltage rail and cross to the high side of the reference voltage. Hence, the transition arrow from the state 00 to the state 01 is labeled with the characters "1/b". Similarly, if the previous two transmitted bits were 11, and the next bit is a 0, a high slew rate is also preferred because the signal line must transition from a voltage level close to the higher voltage rail and cross to the low side of the reference voltage. The transition arrow from the state 11 to the state 10 is labeled with the characters "0/b".

In FIG. 3A, if the previous two transmitted bits were 01, and the next bit is a 0, the slower nominal slew rate could be used. The transition arrow from the state 01 to the state 10 is labeled with the characters "0/c". Similarly, if the previous two bits were 10, and the next bit is a 1, the slower nominal slew rate could be used. The transition from the state 01 to the state 10 is labeled with the characters "1/c". In these two cases, the voltage on the line has not had a sufficient time to approach the respective rail voltage before the signal is switched.

As further illustrated in FIG. 3A, when the input bit does not change, the slew rate is not relevant. For example, when the previously transmitted bits were 00 or 10 and the next bit to be transmitted is a 0, no transition in voltage level will occur. Similarly, when the previously transmitted bits were 11 or 01 and the next bit to be transmitted is a 1, no transition in voltage level will occur. Thus, the transition arrows from the states 00 and 10 to the state 00 are labeled with the characters "0/x", and the transition arrows from the states 11 and 01 to the state 11 are labeled with the characters "1/x".

Figure 3B:
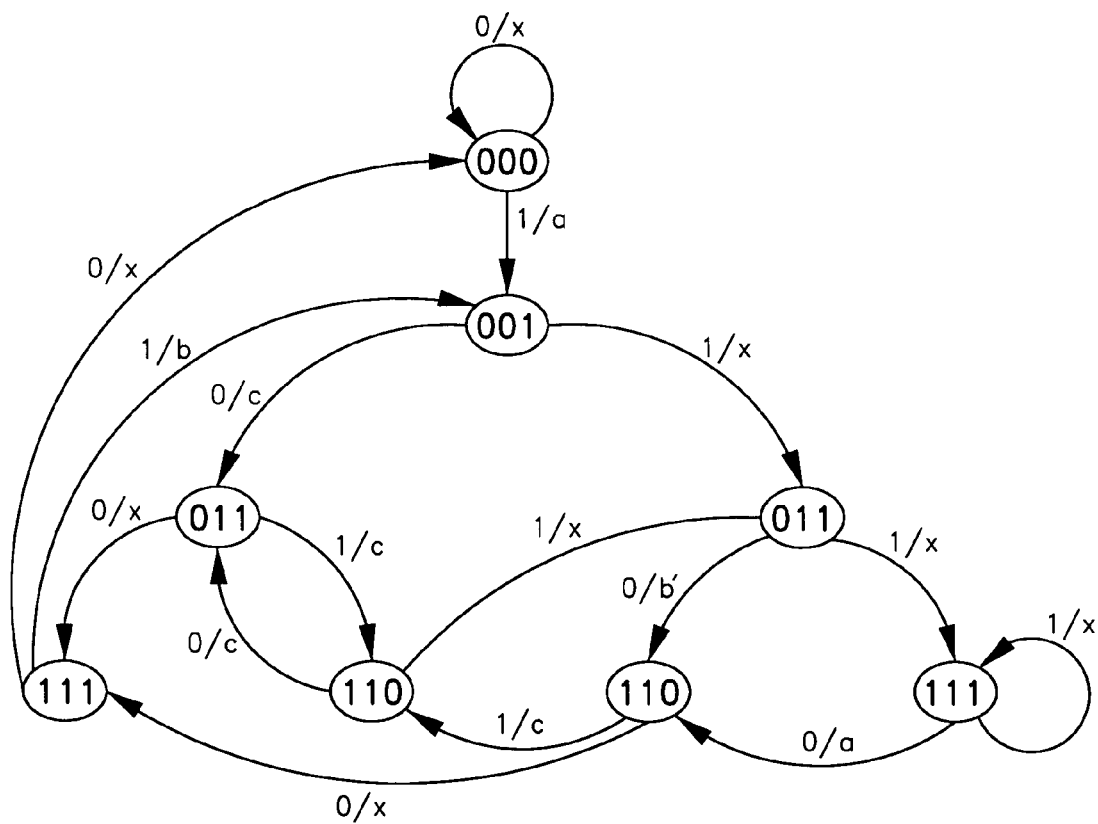

A state diagram of another embodiment of the state machine is illustrated in FIG. 3B. The embodiment of FIG. 3B records 3 bits and outputs one of four control signals for the selection of the slew rate. The increased number of states in the state machine of FIG. 3B allows three slew rates to be generated in addition to the don't care state discussed above. As discussed above, an output character "c" represents a nominal slew rate when the input bit is toggling from one logic level to the other voltage level on each clock cycle. The output character "b" represents a faster slew rate when the input bit has remained at the same logic level for two clock cycles such that the voltage on the signal line has increased or decreased toward the respective rail voltage. In FIG. 3B, an output character "a" represents a fastest slew rate to be used when the input bit has remained at the same logic level for at least three clock cycles and the voltage on the signal line is at or close to a respective rail voltage.

The current states, the input bits, the next states and the output characters are summarized in the following table:

| CURRENT STATE | INPUT BIT | NEXT STATE | OUTPUT CONTROL |
|---|---|---|---|
| 000 | 0 | 000 | x |
| 000 | 1 | 001 | a |

-continued

| CURRENT STATE | INPUT BIT | NEXT STATE | OUTPUT CONTROL |
|---|---|---|---|
| 001 | 0 | 010 | c |
| 001 | 1 | 011 | x |
| 010 | 0 | 100 | x |
| 010 | 1 | 101 | c |
| 011 | 0 | 110 | b |
| 011 | 1 | 111 | x |
| 100 | 0 | 000 | x |
| 100 | 1 | 001 | b |
| 101 | 0 | 010 | c |
| 101 | 1 | 011 | x |
| 110 | 0 | 100 | x |
| 110 | 1 | 101 | c |
| 111 | 0 | 110 | a |
| 111 | 1 | 111 | x |

In a preferred embodiment, the data to be placed on the line is received in packets of signals in parallel from the memory array of a DRAM device. Preferably, the packets include a plurality of bits ranging between 4 bits and 32 bits. More preferably, the number of bits in each packet ranges between 8 bits and 16 bits. The data are serialized for transmission upon the signal line. This leads to the advantage that the state machine has the next bits to be transmitted available for analysis while the current bit is being transmitted. Thus, the state machine can anticipate the states of the input signals several bits before the input signals are to be transmitted. Preferably, when the last bit of a packet is about to be transmitted, the next packet will have been received so that the state machine will always have information regarding the next bit to be transmitted.

As indicated above, more than three bits can be recorded by the state machine. When additional bits are considered in the slew rate calculation, more intermediate slew rates can be introduced into the design of the state machine. As illustrated in FIG. 3B, when three bits are used, three slew rate states are possible. With each additional bit that is tracked, an additional slew rate can be implemented. However, the addition of intermediate slew rates has diminishing returns because the capacitive effect of the transmission line causes a non-linear transition of the voltage levels of the signal towards the respective rail voltage. In particular, the voltage does not change significantly as the line remains static past a few bits (e.g., for more than three clock cycles). After a few clock cycles, the signal asymptotically approaches the respective rail voltage (e.g., either the signal ground or the power supply voltage), and changes very little during subsequent clock cycles. Since the signal voltage is not changing, there is little, if any, benefit of tracking additional bits to provide additional control of the slew rate.

The slew rate is determined by a number of factors, including the characteristics of the transmission line (e.g., the resistance, capacitance and inductance of the line), the loading of the receiving circuit, and the output impedance of the driving circuit. The characteristics of the transmission line cannot be readily adjusted on a bit-by-bit basis; however, the characteristics of the driving circuit can be adjusted to vary the slew rate on a bit-by-bit basis.

Figure 4A:
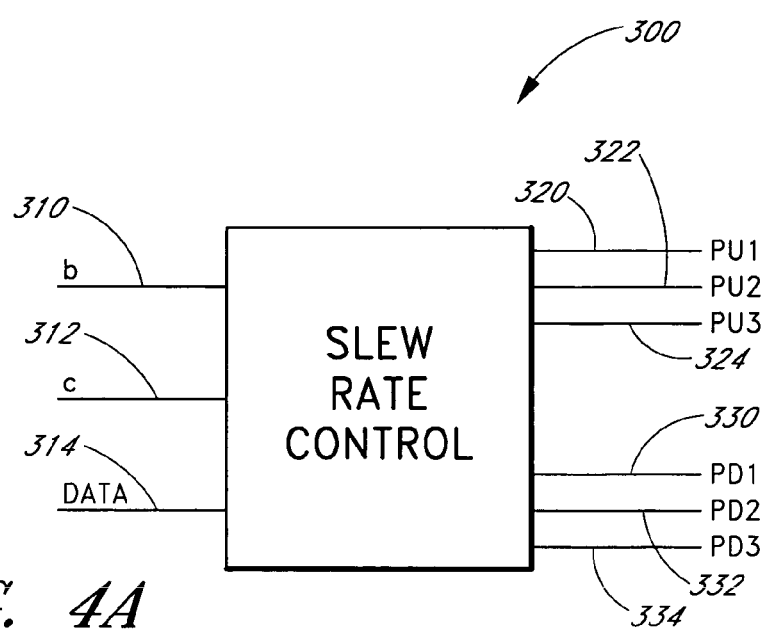
FIGS. 4A, 4B and 4C illustrate preferred embodiments of a slew rate controller and a driving circuit.

FIG. 4A illustrates an embodiment of a slew rate controller 300 responsive to the outputs of a state machine represented by the state diagram in FIG. 3A. In particular, the slew rate controller 300 receives the slew rate control signal "b" on an input line 310 and receives the slew rate control signal "c" on an input line 312. The slew rate controller 300 combines the slew rate control signals "b" and "c" with the value of the next bit, which is received on an input line 314.

Although shown as a separate device, it should be understood that in another embodiment, the slew rate controller 300 is advantageously integrated with the state machine. In particular, the slew rate controller 300 advantageously includes a state machine that analyzes the past data and also selects and implements the slew rate.

The slew rate controller 300 generates pull-up control signals on three output pins. In particular, the slew rate controller 300 generates a PU1 signal on a pin 320, generates a PU2 signal on a pin 322, generates a PU3 signal on a pin 324, generates a PD1 signal on a pin 330, generates a PD2 signal on a pin 332, and generates a PD3 signal on a pin 334.

Figure 4B:
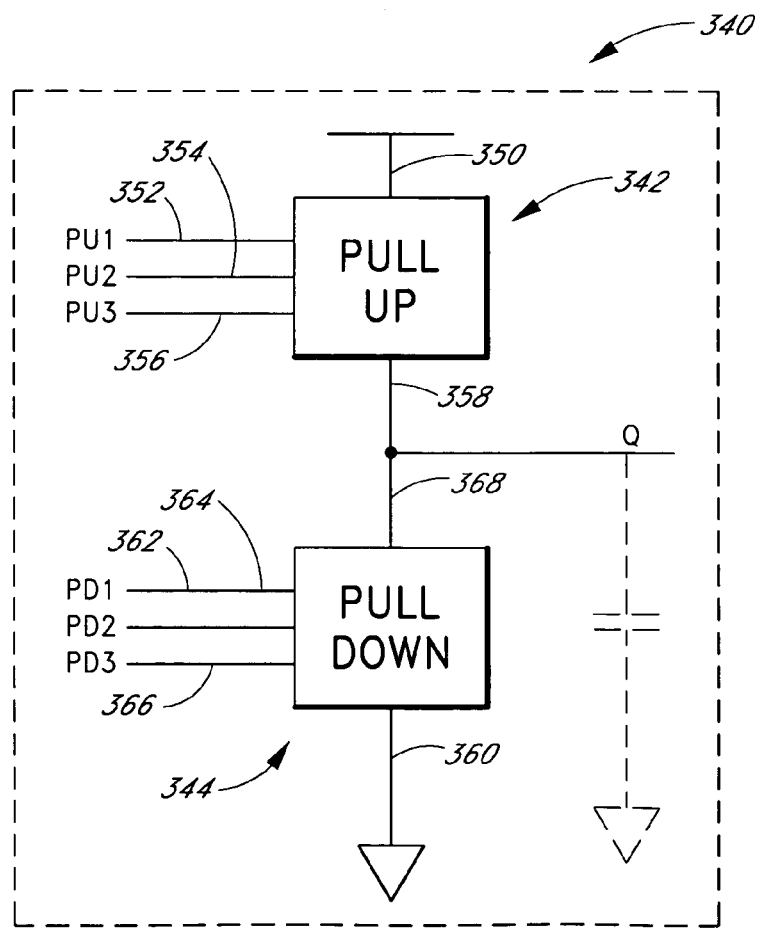

Preferably, the six output pins of the slew rate controller 300 are connected to a driving circuit 340, as illustrated in FIG. 4B. The driving circuit 340 comprises a pull-up section 342 and a pull-down section 344. The pull-up section 342 has a power input 350 connected to the upper voltage rail and has a first control input 352, a second control input 354 and a third control input 356 that receive the PU1 signal, the PU2 signal and the PU3 signal, respectively. The pull-up section 342 has an output 358 connected to the transmission line 120 (FIG. 1).

The pull-down section 344 has a power input 360 connected to the lower voltage rail (e.g., signal ground or another relatively low voltage with respect to the upper voltage rail). The pull-down section 344 has a first control input 362, a second control input 364 and a third control input 366 that receive the PD1 signal, the PD2 signal and the PD3 signal, respectively. The pull-down section 344 has an output 368 connected to the transmission line 120 (FIG. 1) and thus connected in common with the output 358 of the pull-up section 342.

Figure 4C:
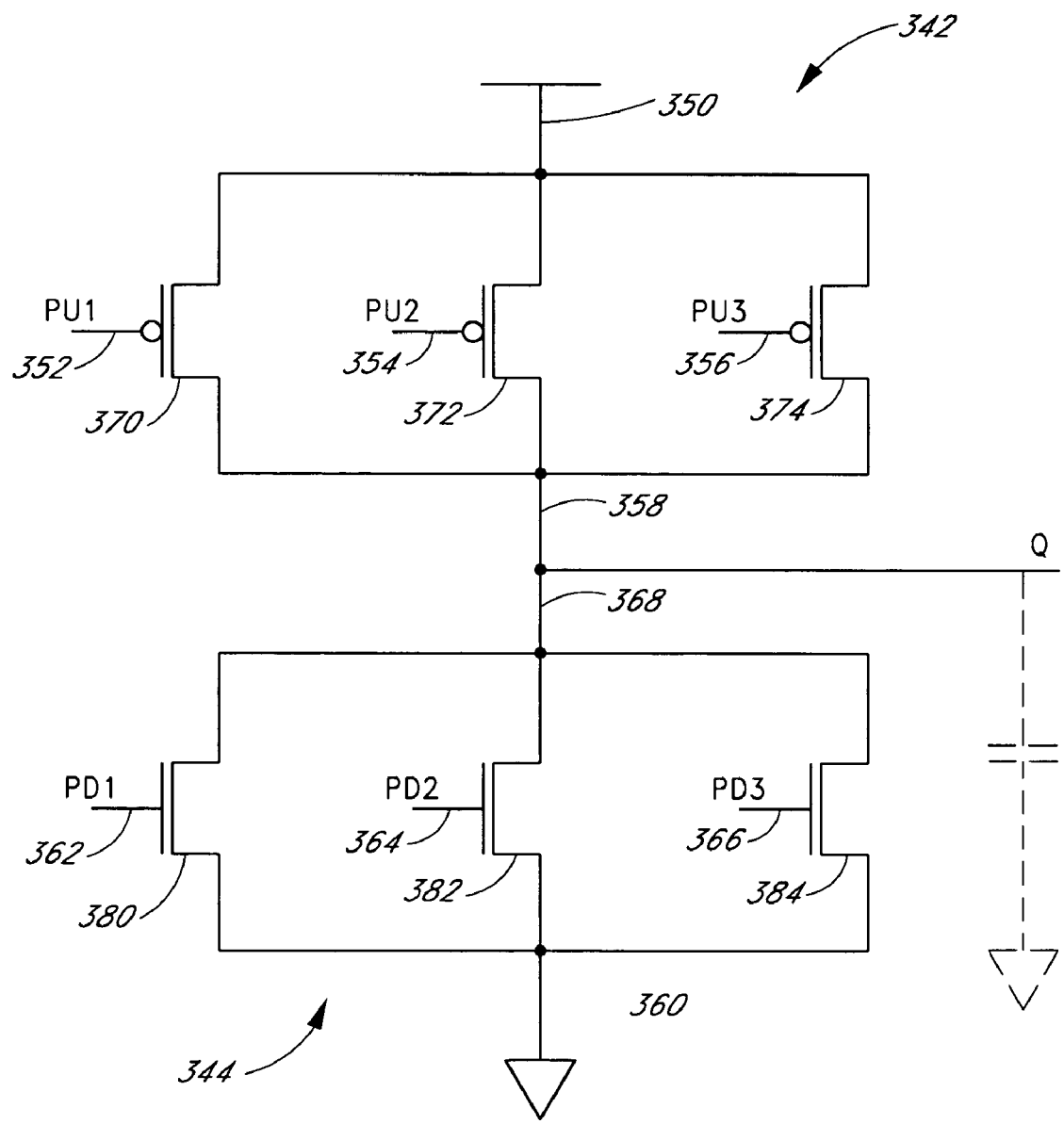

FIG. 4C illustrates the driver 340 in more detail. The pull-up section 342 comprises a first p-channel Metal-Oxide-Semiconductor Field-Effect-Transistors (MOSFET) 370, a second p-channel MOSFET 372 and a third p-channel MOSFET 374 connected in parallel between the power input 350 and the output 358. (The p-channel MOSFETs are also referred to herein as PMOS transistors.) Each p-channel MOSFET 370, 372, 374 has a respective control terminal that enables conduction through the MOSFET when the voltage applied to the control terminal is low with respect to the power input (e.g., the upper voltage rail). The control terminal of the MOSFET 370 is connected to the first control input 352 to receive the PU1 signal. The control terminal of the MOSFET 372 is connected to the second control input 354 to receive the PU2 signal. The control terminal of the MOSFET 374 is connected to the third control input 356 to receive the PU3 signal.

The pull-down section 344 comprises a first n-channel MOSFET 380, a second n-channel MOSFET 382 and a third n-channel MOSFET 384 connected in parallel between the power input 360 and the output 368. (The n-channel MOSFETs are also referred to herein as NMOS transistors.) Each n-channel MOSFET 380, 382, 384 has a respective control terminal that enables conduction through the MOSFET when the voltage applied to the control terminal is high with respect to the power input (e.g., high with respect to the lower voltage rail (e.g., signal ground)). The control terminal of the MOSFET 380 is connected to the first control input 362 to receive the PD1 signal. The control terminal of the MOSFET 382 is connected to the second control input 364 to receive the PD2 signal. The control terminal of the MOSFET 384 is connected to the third control input 364 to receive the PD3 signal.

The DC impedance of the pull-up section 342 is determined by the number of p-channel MOSFETs that are active at the same time, and the DC impedance of the pull-down section 344 is determined by the number of n-channel MOSFETs that are active at the same time. The slew rate controller 300 generates the pull-up signals and the pull-down signals in selected sequences to activate the MOSFETs as appropriate to produce the selected slew rate. In effect, the slew rate controller implements the selected slew rate by selecting the resistance of the charging section 342 or the discharging section 344.

Because the DC power supply that supplies the upper rail voltage appears as an AC ground, the active MOSFETs in the pull-up section 342 appear to be in parallel with the active MOSFETs in the pull-down section 344 with respect to the AC characteristics. In the preferred embodiment, the total number of MOSFETs that are active at the same time is selected to be constant. In particular, as described below, three MOSFETs are always active in one of the following combinations:

three p-channel MOSFETs active
two p-channel MOSFETs and one n-channel MOSFET
one p-channel MOSFET and two n-channel MOSFETs; and
three n-channel MOSFETs.

Figure 5A:
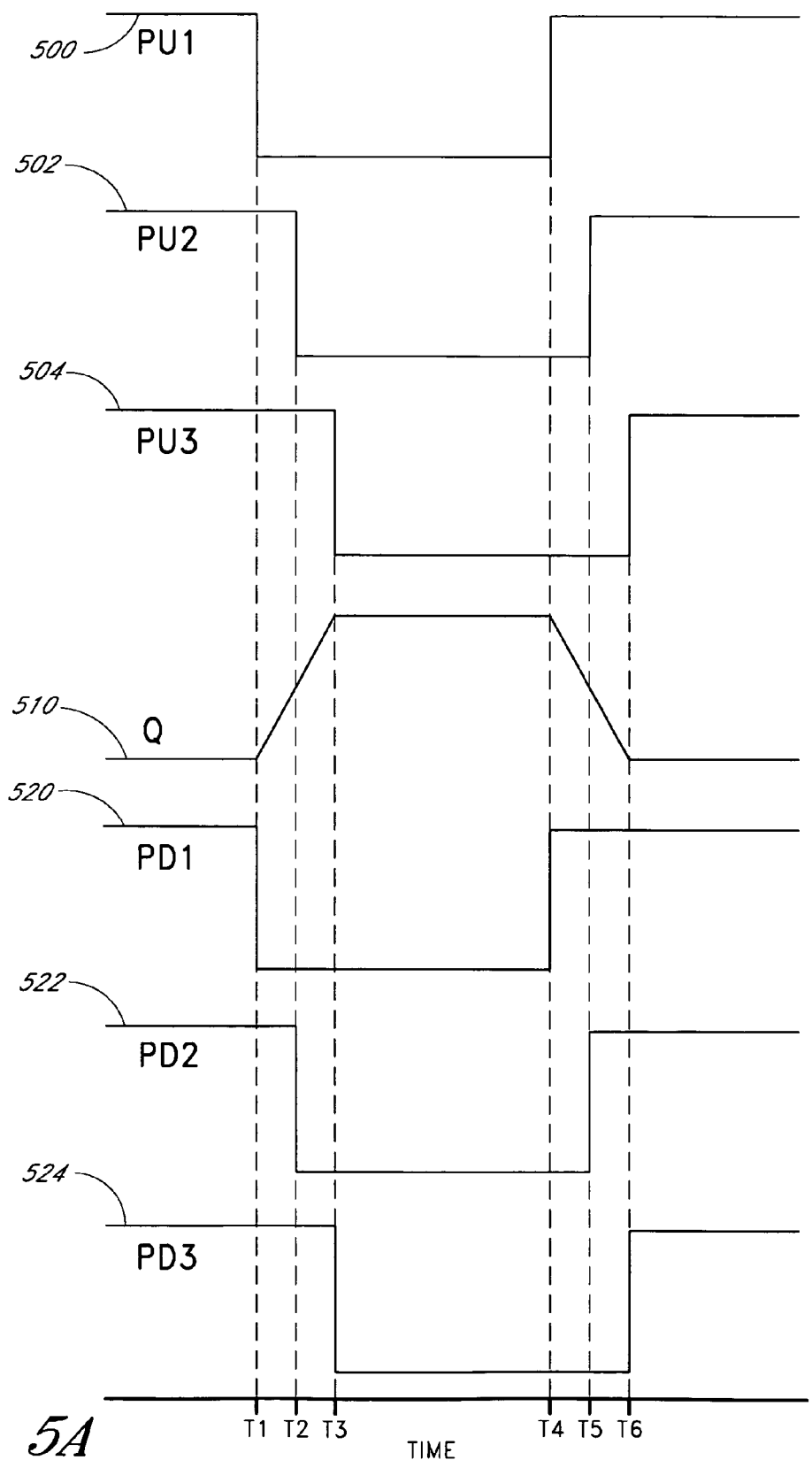
FIGS. 5A and 5B illustrate timing diagrams of a driver circuit in accordance with a preferred embodiment.
Figure 5B:
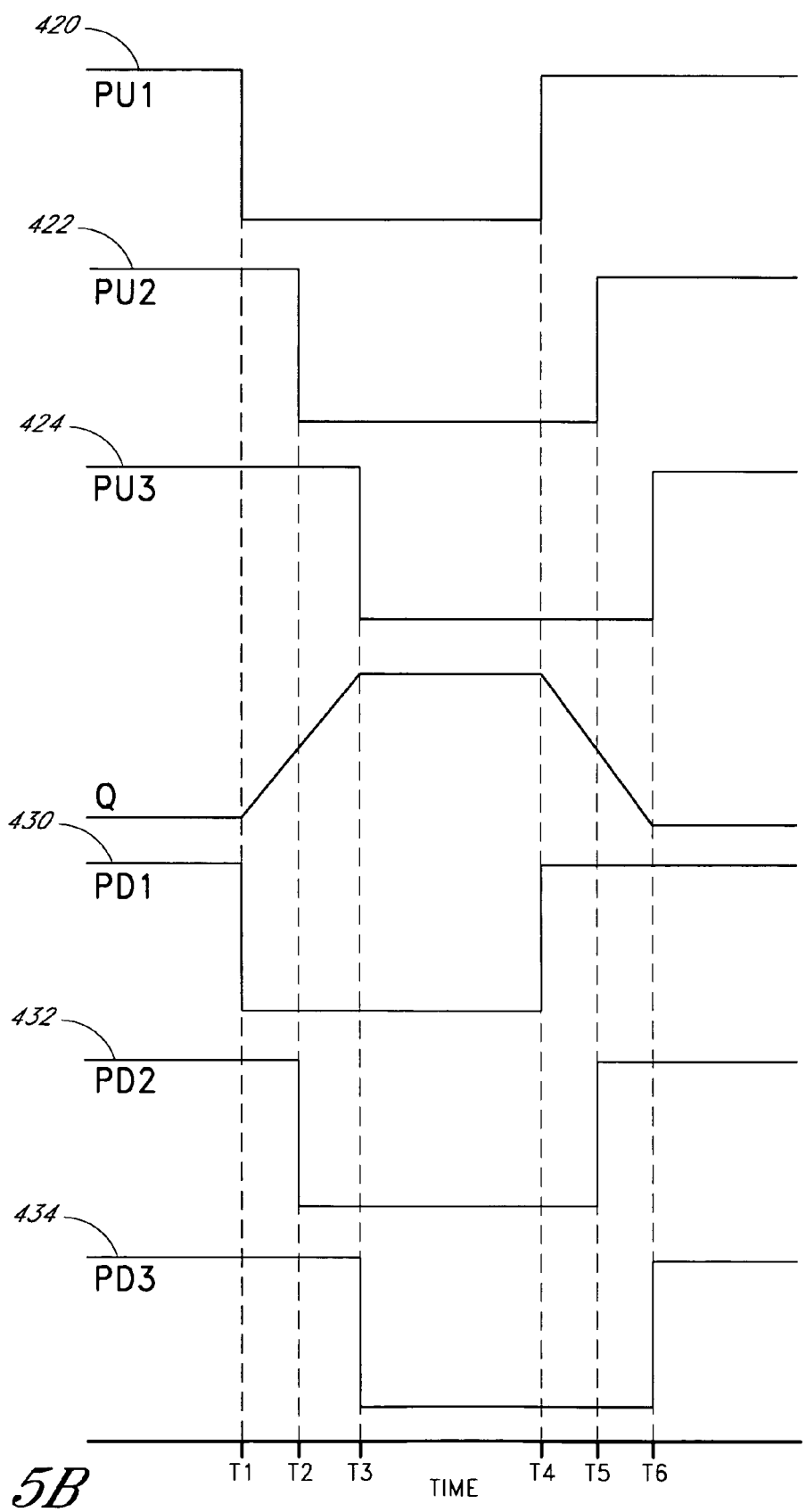

Sample timing diagrams for the pull-up signals and the pull-down signals are illustrated FIGS. 5A and 5B. In particular, FIG. 5A illustrates the timing of the pull-up signals and the pull-down signals to produce a fast slew rate when the fast slew rate control signal "b" is active. FIG. 5B illustrates the timing of the pull-up signals and the pull-down signals to produce a nominal slew rate when the nominal slew rate control signal "c" is active. The times at which the transistors in the driving circuit 440 are switched are varied to select the required slew rate. For example, in FIG. 5B, the intervals between switching times is greater than the corresponding intervals in FIG. 5A. More separation between the switching of the transistors leads to a slower slew rate. Thus, the rate of change (i.e., the slew rate) of the voltage (waveform Q) on the transmission line 120 in FIG. 5B is less than the rate of change of the voltage (waveform Q) on the transmission line 120 in FIG. 5A.

In FIG. 5A, a waveform 500 represents the voltage on the PU1 signal as a function of time, a waveform 502 represents the voltage on the PU2 signal, a waveform 504 represents the voltage on the PU3 signal, a waveform 510 represents the voltage on Q signal on the transmission line 120, a waveform 520 represents the voltage on the PD1 signal, a waveform 522 represents the voltage on the PD2 signal, and a waveform 524 represents the voltage on the PD3 signal. Initially, the PU1 signal, the PU2 signal and the PU3 signal all have a high voltage level such that the respective p-channel MOSFETs 370, 372, 374 are all turned off. Similarly, the PD1 signal, the PD2 signal and the PD3 signal also all have a high voltage level such that the respective n-channel MOSFETs 380, 382, 384 are all turned on. Since only the pull-down transistors are turned on, the Q signal (waveform 510) is low (e.g., at signal ground). At a time T1, the PU1 signal becomes active low and the PD1 signal becomes inactive low such that the first p-channel MOSFET 370 is turned on and the first n-channel MOSFET is turned off. Thus, the voltage of the Q signal begins to increase from signal ground toward the upper voltage rail. A short time later, at a time T2, the PU2 signal becomes active low and the PD2 signal becomes inactive low to turn on the second p-channel MOSFET 372 and to turn off the second n-channel MOSFET 382. The Q signal voltage continues to increase toward the upper voltage rail. At a time T3, the PU3 signal becomes active low and the PD3 signal becomes inactive low to turn on the third p-channel MOSFET 374 and to turn off the third n-channel MOSFET 384. The Q signal voltage increases to the upper voltage rail and remains at that level until the first p-channel MOSFET 370 and the first n-channel MOSFET 380 are again switched beginning at a time T4 when the PU1 signal is turned off and the PD1 signal is turned on. The Q signal voltage begins to decrease and continues to decrease at a time T5, when the PU2 signal switches high to turn off the second p-channel MOSFET 372, and the PD2 signal switches high to turn on the second n-channel MOSFET. Thereafter, at a time T6, the PU3 signal switches high to turn off the third p-channel MOSFET 374, and the PD3 signal switches high to turn on the third n-channel MOSFET 384.

The waveforms in FIG. 5B are similar to the waveforms in FIG. 5A and are identified accordingly. In FIG. 5B, the times T1, T2 and T3 are spaced farther apart than the corresponding times in FIG. 5A. Similarly, the times T4, T5 and T6 are spaced farther apart in FIG. 5B. Because of the increased spacing between the switching times, the Q waveform in FIG. 5B has slower rise times and fall times than the Q waveform in FIG. 5A.

As discussed above, the waveforms in FIG. 5A are generated when the high slew rate signal "b" is active, and the waveforms in FIG. 5B are generated when the nominal slew rate signal "c" is active.

Figure 6:
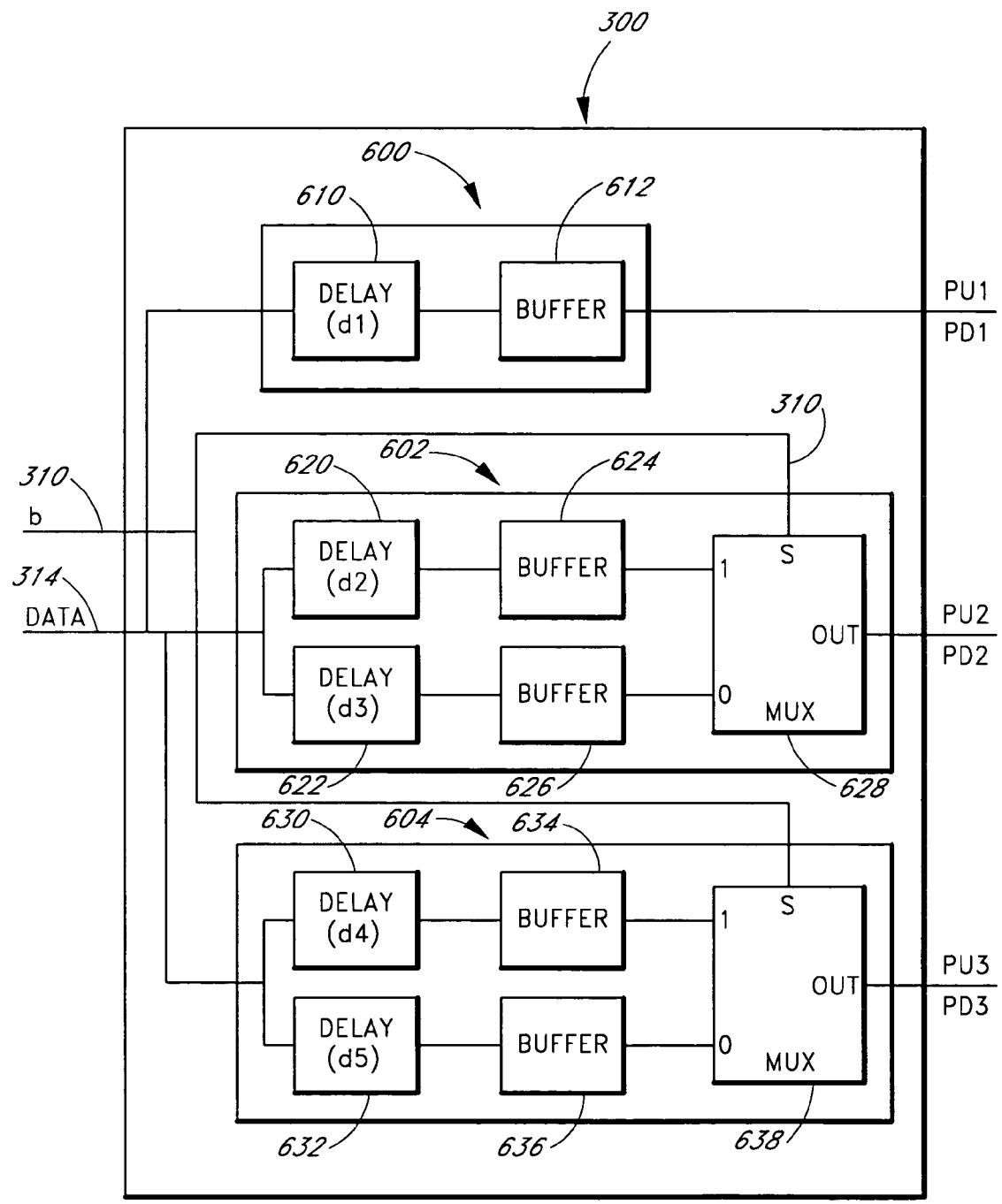
FIG. 6 illustrates details of an exemplary embodiment of a slew rate controller responsive to a single slew rate control signal.

FIG. 6 illustrates additional details of an exemplary embodiment of the slew rate controller 300. The slew rate controller 300 comprises a first control signal generator 600 that generates a first output signal, a second signal generator 602 that generates a second output signal, and a third signal generator 604 that generates a third output signal. In the embodiment described herein wherein the PU1 signal and the PD1 signal are switched to and from the same levels at the same time, as illustrated in FIG. 5A and FIG. 5B, the PU1 signal and the PD1 signal are both connected to the first output signal. Similarly, the PU2 signal and the PD2 signal are both connected to the second output signal. The PU3 signal and the PD3 signal are both connected to the third output signal.

The first slew rate control signal generator 600 comprises a first delay element 610 and a first output buffer 612. The data signal on the input 314 is provided as an input to the first delay element 610. The first delay element 610 delays the data signal by a time duration d1, and the output of the first delay element 610 provides the d1-delayed data signal to an input to the output buffer 612. The output of the output buffer 612 is the first output signal and thus is the PU1 signal and the PD1 signal.

The second slew rate control signal generator 602 comprises a second delay element 620, a third delay element 622, a second buffer circuit 624, a third buffer circuit 626, and a first multiplexer ("MUX") 628. The data signal on the input line 314 is provided as an input to the second delay element 620 and is provided as an input to the third delay element 622. The second delay element 620 delays the data signal by a time duration d2, and the third delay element 622 delays the data signal by a time duration d3. The output of the second delay element 620 provides the d2-delayed data signal to a first input (1) of the first multiplexer 628 via the second buffer circuit 624. The output of the third delay element 622 provides the d3-delayed data signal to a second input (0) of the first multiplexer 628 via the third buffer circuit 626. The first multiplexer 628 has a control input (S) that is controlled by the slew control signal "b" on the input line 310. When the slew control signal "b" on the input line 310 is high, the first multiplexer 628 provides the d2-delayed data signal on the first input (1) as the second output signal corresponding to the PU2 signal and the PD2 signal. When the slew control signal "b" on the input line 310 is low, the first multiplexer 628 provides the d3-delayed data signal on the second input (0) as the second output signal corresponding to the PU2 signal and the PD2 signal.

The third slew rate control signal generator 604 comprises a fourth delay element 630, a fifth delay element 632, a fourth buffer circuit 634, a fifth buffer circuit 636, and a second multiplexer ("MUX") 638. The data signal on the input 314 is provided as an input to the fourth delay element 630 and is provided as an input to the fifth delay element 632. The fourth delay element 630 delays the data signal by a time duration d4, and the fifth delay element 632 delays the data signal by a time duration d5. The output of the fourth delay element 630 provides the d4-delayed data signal to a first input (1) of the second multiplexer 638 via the fourth buffer circuit 634. The output of the fifth delay element 632 provides the d5-delayed data signal to a second input (0) of the second multiplexer 638 via the fifth buffer circuit 636. The second multiplexer 638 has a control input (S) that is controlled by the slew control signal "b" on the input line 310. When the slew control signal "b" on the input line 310 is high, the second multiplexer 638 provides the d4-delayed data signal on the first input (1) as the third output signal corresponding to the PU3 signal and the PD3 signal. When the slew control signal "b" on the input line 310 is low, the second multiplexer 638 provides the d5-delayed data signal on the second input (0) as the third output signal corresponding to the PU3 signal and the PD3 signal.

The delays provided by each of the delay elements 612, 622, 624, 632, 634 are selected to provide the timing relations shown in FIGS. 5A and 5B. For example, the following relationships between the delay elements are advantageous in one particular embodiment:

d1<d2<d4
d1<d3<d5
d2<d3
d4<d5

In certain embodiments, the first delay d1 can be set to 0 so that the first output that provides the PU1 signal and the PD1 signal switches immediately after the data signal changes.

It will be appreciated that in the embodiment of FIG. 6, only the fast slew rate signal "b" is required to control the slew rate. This results because there are only two active slew rates. When the data does not change in consecutive clock cycles, the slew rate is not relevant, as indicated by the don't care conditions ("x") discussed above. Although the signal is not changing, the slew rate for the don't care condition can be set for either the fast slew rate "b" or the nominal slew rate "c". In FIG. 6, the second control signal generator 602 and the third control signal generator 604 only needs to distinguish between the fast slew rate when the "b" slew rate control signal is active and the combined nominal slew rate and no slewing when either the "c" slew rate control signal is active or the "x" don't care signal is active. Thus, the circuit in FIG. 6 only needs to distinguish between an active "b" signal and an inactive "b" signal as illustrated.

Figure 7:
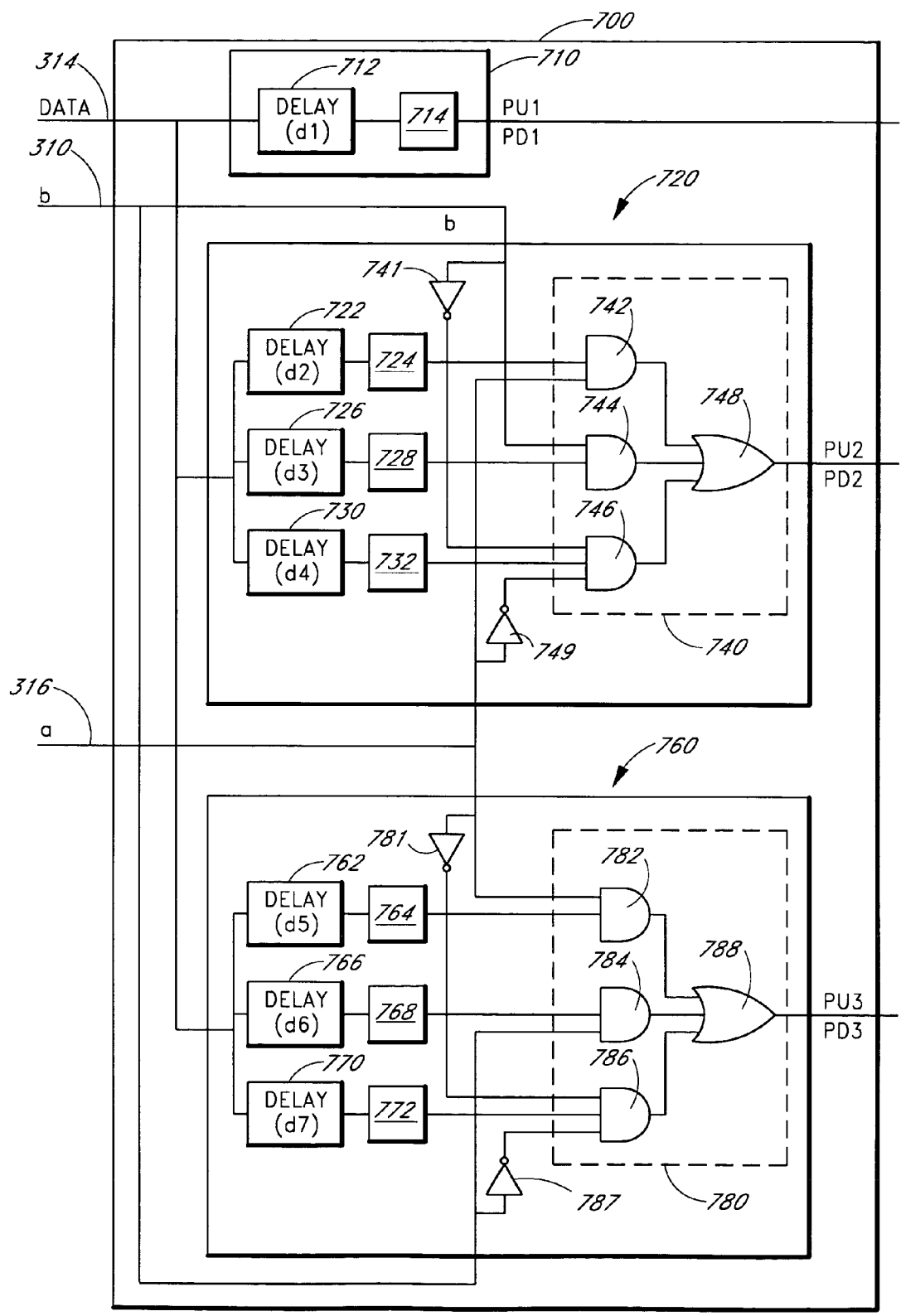
FIG. 7 illustrates details of an exemplary embodiment of a slew rate controller responsive to two slew rate control signals.

As illustrated by a slew rate controller 700 in FIG. 7, the slew rate controller 300 of FIG. 6 is readily expanded to accommodate the additional slew rate control signal "a" from the state diagram of FIG. 3B. In the slew rate controller 700, a first slew rate control signal generator 710 corresponds to the first slew rate control signal generator 600 of FIG. 6 and includes a first d1-delay element 712 and a first buffer circuit 714.

A second slew rate control signal generator 720 in FIG. 7 includes a second d2-delay element 722, a second buffer circuit 724, a third d3-delay element 726, a third buffer circuit 728, a fourth d4-delay element 730 and a fourth buffer circuit 732. A first multiplexer 740 is advantageously implemented as a first AND-gate 742, a second AND-gate 744, a third AND-gate 746, and an OR-gate 748. The first AND-gate 742 has a first input that receives the output of the second d2-delay element 722 via the second buffer circuit 724, has a second input that receives the "a" control signal on an input line 316. The second AND-gate 744 has a first input that receives the output of the third d3-delay element 726 via the third buffer circuit 728 and has a second input that receives the "b" control signal from an input line 310. The third AND-gate 746 has a first input that receives the output of the fourth d4-delay element 730 via the fourth buffer circuit 732 and a second input that receives the "b" control signal through an inverter 741, and has a third input that receives an "a" control signal through an inverter 749. The outputs of the first AND-gate 742, the second AND-gate 744 and the third AND-gate 746 are provided as inputs to the first OR-gate 748. The output of the first OR-gate 748 is the combined PU2 signal and PD2 signal.

A third slew rate control signal generator 760 in FIG. 7 includes a fifth d5-delay element 762, a fifth buffer circuit 764, a sixth d6-delay element 766, a sixth buffer circuit 768, a seventh d7-delay element 770 and a seventh buffer circuit 772. A second multiplexer 780 is advantageously implemented as a fourth AND-gate 782, a fifth AND-gate 784, a sixth AND-gate 786, and a second OR-gate 788. The fourth AND-gate 782 has a first input that receives the output of the fifth d5-delay element 772 via the fifth buffer circuit 774, and has a second input that receives the "a" control signal from the input line 316. The fifth AND-gate 784 has a first input that receives the output of the sixth d6-delay element 766 via the sixth buffer circuit 768 and has a second input that receives the "b" control signal. The sixth AND-gate 786 has a first input that receives the output of the seventh d7-delay element 770 via the seventh buffer circuit 772 and has a second input that receives the "b" through an inverter 787, and has a third input that receives the inverted "a" control signal through an inverter 781. The outputs of the sixth AND-gate 782, the seventh AND-gate 784 and the eighth AND-gate 786 are provided as inputs to the second OR-gate 788. The output of the second OR-gate 788 is the combined PU3 signal and PD3 signal.

In order to provide the three slew rates, the following relationships between the delays d1, d2, d3, d4, d5, d6 and d7 are advantageously implemented:

d1<d2<d5
d1<d3<d6
d1<d4<d7
d2<d3<d4
d5<d6<d7

Note that in the embodiment of FIG. 7, the don't care condition and the "c" condition are combined as being present when neither the "a" condition nor the "b" condition is present. Thus, the don't care condition is implemented as the nominal slew rate so that the voltage level on the output does not change if the data signal does not change.

Having thus described the preferred embodiments of the present invention, those of skill in the art will readily appreciate that yet other embodiments may be made and used within the scope of the claims hereto attached. Numerous advantages of the invention covered by this document have been set forth in the foregoing description. It will be understood, however, that this disclosure is, in many respects, only illustrative. Changes may be made in details without exceeding the scope of the invention.

What is claimed is:

1. A method of increasing bit valid time on a signal line, the method comprising:
    tracking values of a sequence of bits received by a driving device and transmitted on a signal line by the driving device;
    determining a current state of the signal line based on the values of a selected number of most recently received bits in the sequence on the signal line; and
    adjusting a slew rate of the driving device in response to the current state of the signal line and in response to a value of a next bit in the sequence of bits.

2. The method of claim 1, wherein adjusting the slew rate further comprises setting the slew rate to one of at least a first rate and a second rate, wherein the first rate is faster than the second rate.

3. The method of claim 2, wherein adjusting the slew rate further comprises comparing the value of the next bit with the values of the selected number of most recently received bits in the sequence.

4. The method of claim 3, further comprising setting the slew rate to the first rate when each of the selected number of most recently received bits is a first logic level and when the next bit is a second logic level different from the first logic level.

5. The method of claim 4, wherein the selected number of most recently received bits further comprises a first bit adjacent the next bit and a second bit adjacent the first bit, and further comprising setting the slew rate to the second rate when the first bit is the first logic level and each of the next bit and the second bit is the second logic level.

6. The method of claim 5, further comprising allowing the slew rate to remain substantially unchanged when the next bit and the first bit each have the same logic level.

7. The method of claim 1, wherein adjusting the slew rate further comprises setting the slew rate to one of at least three different predetermined rates.

8. The method of claim 1, wherein selecting the slew rate comprises changing an impedance of a charging section and a discharging section of the driving device.

9. The method of claim 1, further comprising receiving the sequence of bits from a dynamic random access memory (DRAM) device.

10. A memory device comprising:
    input;
    an output configured to transmit on a signal line a sequence of data bits received by the input; and
    a module configured to monitor the sequence of data bits and to output a slew rate control signal based on at least two most recent bits in the sequence of bits and a next bit in the sequence of bits.

11. The memory device of claim 10, further comprising a slew rate controller configured to adjust a rate of change of voltage on the signal line based on the slew rate control signal.

12. The memory device of claim 11, wherein the slew rate controller further comprises:
    at least one delay element;
    at least one output buffer; and
    at least one multiplexer.

13. The memory device of claim 11, wherein the slew rate controller comprises a plurality metal oxide semiconductor field effect transistors (MOSFETs).

14. The memory device of claim 13, wherein each of the plurality of MOSFETs is in a parallel configuration and is independently controllable, each MOSFET being turned on and turned off at a respective time selected to control the rate of change of voltage on the signal line.

15. The memory device of claim 10, wherein the module comprises a state machine.

16. The memory device of claim 10, wherein the signal line comprises a single-ended transmission line.

17. The memory device of claim 10, further comprising a dynamic random access memory (DRAM) array.

18. A memory device for adjusting a slew rate of a bit sequence on a signal line, the memory device comprising:
    means for tracking values of a sequence of bits received by the memory device and transmitted on a signal line by the memory device;
    means for determining a current state of the signal line based on the values of a selected number of most recently received bits in the sequence of bits on the signal line; and
    means for outputting a slew rate control signal based on the current state of the signal line and on a value of a next bit in the sequence of bits.

19. The memory device of claim 18, further comprising means for adjusting a slew rate of the memory device based on the slew rate control signal.

20. The memory device of claim 19, further comprising a memory array.

* * * * *